(12) United States Patent
Kao

(10) Patent No.: US 7,446,690 B2
(45) Date of Patent: Nov. 4, 2008

(54) APPARATUS AND METHOD FOR IMPLEMENTING AN ANALOG-TO-DIGITAL CONVERTER IN PROGRAMMABLE LOGIC DEVICES

(75) Inventor: Oliver C. Kao, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/556,982

(22) Filed: Nov. 6, 2006

(65) Prior Publication Data

US 2008/0106452 A1    May 8, 2008

(51) Int. Cl.
*H03M 1/12*    (2006.01)

(52) U.S. Cl. .................. 341/155; 341/139; 341/141; 341/142; 341/159

(58) Field of Classification Search .......... 341/155, 341/156, 158, 160, 139–142, 159
See application file for complete search history.

(56) References Cited

U.S. PATENT DOCUMENTS

| | | | | |
|---|---|---|---|---|
| 4,386,339 A | * | 5/1983 | Henry et al. | ............... 341/159 |
| 4,485,372 A | | 11/1984 | Holloway | |
| 5,016,014 A | | 5/1991 | Bitting | |
| 5,184,130 A | | 2/1993 | Mangelsdorf | |
| 5,194,867 A | * | 3/1993 | Fisher | ........................ 341/159 |
| 5,225,837 A | | 7/1993 | Hosotani et al. | |
| 5,563,526 A | * | 10/1996 | Hastings et al. | ............... 326/37 |
| 5,623,265 A | * | 4/1997 | Pawar et al. | ................. 341/160 |
| 5,696,508 A | | 12/1997 | Gross, Jr. et al. | |
| 5,801,657 A | * | 9/1998 | Fowler et al. | ................. 341/155 |
| 5,821,776 A | * | 10/1998 | McGowan | ..................... 326/41 |
| 5,877,632 A | * | 3/1999 | Goetting et al. | ............... 326/50 |
| 6,222,476 B1 | * | 4/2001 | Lee et al. | ..................... 341/159 |
| 6,246,258 B1 | | 6/2001 | Lesea | |
| 6,288,664 B1 | | 9/2001 | Swanson | |
| 6,351,145 B1 | | 2/2002 | Lesea | |
| 6,433,727 B1 | | 8/2002 | Yoshinaga | |
| 6,437,721 B1 | | 8/2002 | Kitagawa | |
| 6,445,329 B1 | * | 9/2002 | Abassi et al. | ................ 341/156 |
| 6,480,135 B2 | * | 11/2002 | Gendai | ........................ 341/159 |
| 6,559,783 B1 | * | 5/2003 | Stoneking | .................... 341/141 |
| 6,710,731 B1 | | 3/2004 | Kaplish et al. | |
| 6,864,821 B2 | | 3/2005 | Yang | |
| 7,242,335 B2 | * | 7/2007 | Rubin et al. | ................. 341/141 |
| 7,271,751 B2 | * | 9/2007 | Peterson et al. | ............. 341/120 |
| 2006/0158362 A1 | | 7/2006 | Shimizu et al. | |

* cited by examiner

*Primary Examiner*—Linh V Nguyen
(74) *Attorney, Agent, or Firm*—Schwegman, Lundberg & Woessner, P.A.

(57) ABSTRACT

An apparatus and method for providing an analog-to-digital converter (ADC) in programmable logic devices is disclosed. A plurality of multi-purpose input/output (I/O) blocks is configured to provide analog-to-digital conversion and other I/O functionality. The plurality of multi-purpose I/O blocks is also configured to save power when ADC mode is disabled.

18 Claims, 5 Drawing Sheets

APPARATUS AND METHOD FOR IMPLEMENTING AN ANALOG-TO-DIGITAL CONVERTER IN PROGRAMMABLE LOGIC DEVICES

FIELD OF INVENTION

The present invention is related to an apparatus and method for providing an analog-to-digital converter (ADC) in programmable logic devices. More particularly, the present invention is related to implementing ADCs in devices such as programmable logic devices (PLDs), complex programmable logic devices (CPLDs), and field-programmable gate arrays (FPGAs).

BACKGROUND

The increasing consumer demand for new and cheaper electronic devices continues to drive the semiconductor industry to decrease product life cycles and reduce costs. As a result, programmable logic devices (PLDs) are becoming the preferred building blocks over application-specific integrated circuits (ASICs) because of their flexibility during the early development stage of a product, allowing for rapid development at low cost.

Programmable logic devices (PLDs), including complex programmable logic devices (CPLDs) and field-programmable gate arrays (FPGAs), are a class of integrated circuits that can be programmed and reprogrammed by the user to implement different logic functions, unlike customized hard-wired chips or ASICs that have set functionality. FPGA and CPLD integrated circuits typically contain an array of internal configurable logic blocks, programmable interconnects and switches, and a periphery of input/output (I/O) blocks. The logic blocks and interconnecting elements are programmed to realize the desired function. The I/O blocks are coupled to I/O pins used to supply power and transport logic signals to and from the logic blocks.

Programmability of a PLD is provided through fuses which are stored in a memory array that may be located on or off chip. Fuses stored off-chip are stored in a memory chip containing non-volatile memory and logic control circuits, such as standard memory or a configurator chip. When power is initially supplied to the PLD, the fuses are downloaded and stored on the PLD. These fuses are lost as soon as the power is cutoff. Fuses stored permanently on-chip are stored in a non-volatile memory array in the PLD and therefore are not lost in the absence of power. Supplying power to the PLD loads some or all of the fuses from the memory array into latches. If only some of the fuses are loaded into latches, the other fuses are read directly from the non-volatile memory array. In this case, a sense amplifier may be used in order to speed up the read-out rate from non-volatile memory. A drawback of using a sense amplifier is that it drains current. Alternatively, the fuses can be loaded externally through the aid of a microcontroller. An externally loaded process may provide greater freedom to update the fuses whenever needed. It also avoids the time-consuming program sequence performed to non-volatile memory both on and off chip.

In addition to the programmability support described above, PLDs may support advanced input/output (I/O) standards such as High-Speed Transceiver Logic (HSTL) classes I, II, III, Stub Series Terminated Logic-3 (SSTL-3) classes I, II, SSTL-2 classes I, II, SSTL-18 classes I, II and others. In order to meet all these single-ended signal standards, a comparator and a reference voltage are preferably provided such that the comparator compares an input signal to the reference voltage to determine whether the input is logic "1" or logic "0". A comparator is preferably located inside each of the I/O blocks and the reference voltage is preferably provided from outside the chip. Purely by way of example, the EIA/JESD8-9 SSTL-2 input standard is provided in Table 1 (shown in the Appendix). The SSTL-2 operating voltage 2.5V±0.2V, and the reference voltage $V_{REF}$ ranges from 1.13V to 1.32V.

For the purpose of higher system integration on a mixed signal platform, it is desirable to implement an analog-to-digital converter (ADC) within PLD circuits that are configured to support advanced I/O standards and accordingly include comparators. Prior art implementations of ADCs in PLDs are inefficient because they include excess circuitry, such as a second I/O pad in each I/O block, and waste space and sacrifice accuracy by spreading resistors over a plurality of I/O blocks. The prior art also lacks the flexibility to adjust the resolution of an ADC result. Additionally, the prior art does not offer the ability to safeguard against current leaks across the resistors, and does not permit the use of digital input and output paths of the I/O blocks when the I/O blocks are being used as part of the ADC. Hence, there exists a need for implementing ADCs within PLDs without the limitations of the prior art.

SUMMARY

An apparatus and method for providing an analog-to-digital converter (ADC) in programmable logic devices is disclosed. A plurality of multi-purpose input/output (I/O) blocks is configured to provide analog-to-digital conversion and other I/O functionality. The plurality of multi-purpose I/O blocks is also configured to save power when ADC mode is disabled.

BRIEF DESCRIPTION OF THE DRAWINGS

A more detailed understanding of the invention may be had from the following description, given by way of example and to be understood in conjunction with the accompanying drawings wherein.

DETAILED DESCRIPTION OF THE PREFERRED EMBODIMENTS

The present invention will be described with reference to the figures wherein like numerals represent like elements throughout. In descriptions forthcoming, a node and a voltage or signal at a node may be used interchangeably. The present invention provides an apparatus and method for efficiently implementing an analog-to-digital converter (ADC) in a programmable logic device (PLD) with mixed-signal capabilities. An analog-to-digital function is implemented using the preexisting components in the I/O blocks and by selectively powering a resistor network that provides reference voltages for the ADC. The ADC implementation does not interfere with the functionality of the components of the PLD except for the comparators during ADC mode. The present invention, purely by way of example, may be implemented in PLDs including field programmable gate arrays (FPGAs) and complex programmable logic devices (CPLDs) which may be programmed using any software or firmware. Furthermore, the present invention may be implemented in any type of integrated circuit where analog-to-digital functionality is desired.

Figure 1:
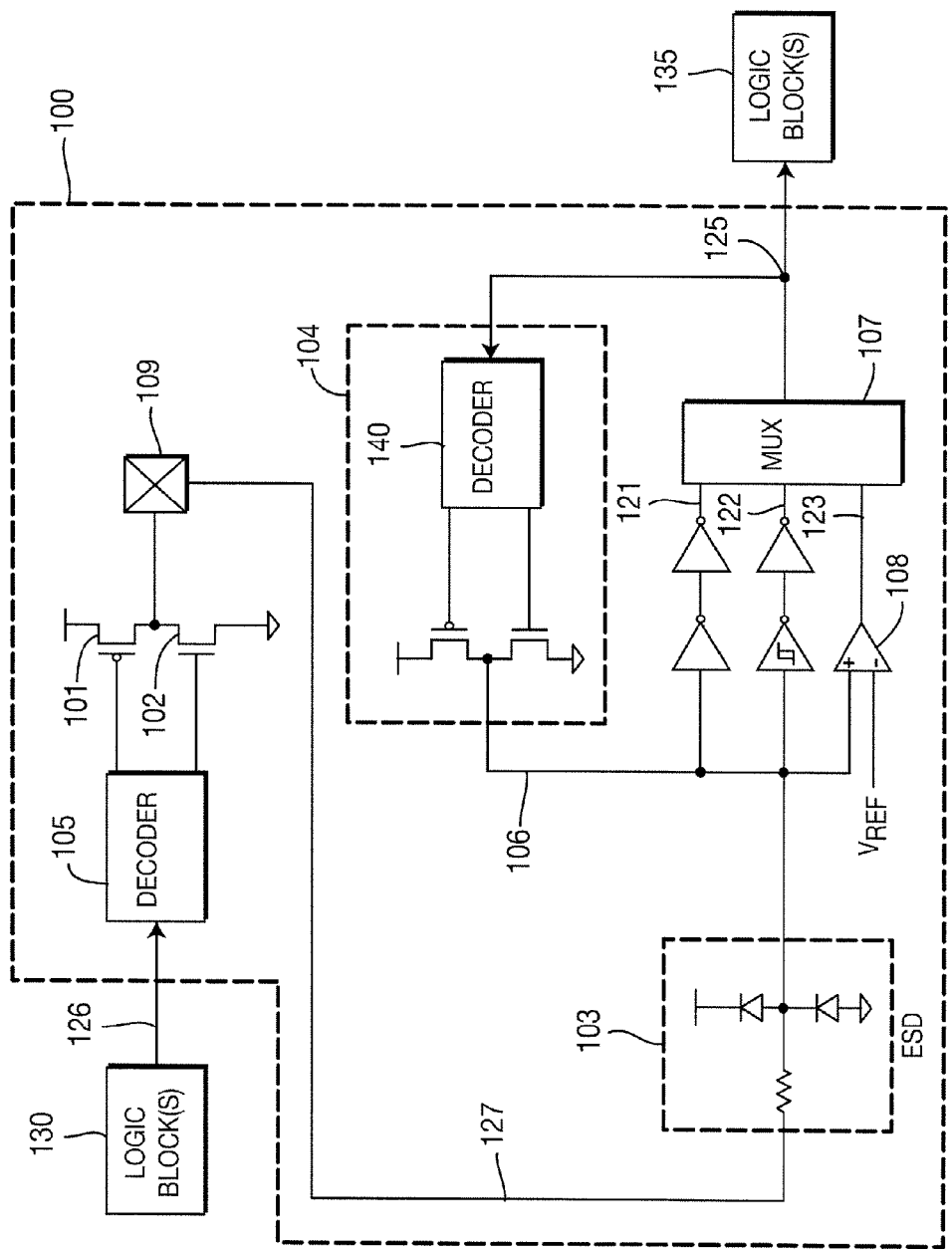
FIG. 1 is an input/output (I/O) block on a programmable logic device (PLD)

By way of introduction, FIG. 1 is an I/O block 100 containing a comparator 108 that converts an analog input signal into an equivalent digital signal to provide it to the internal logic of a PLD chip. A digital output signal 126 from logic blocks 130 is provided to decoder 105. Decoder 105 may be programmed to provide regular drive, low drive, open drain, rail-to-rail, fast-slew rate, or slow-slew rate output signals, as desired. The decoder 105 drives the pull-up PMOS 101 and pull-down NMOS 102, depending upon the programming, to provide the desired output signal to pad 109. Pad 109 may provide the output signal to any components off chip.

An analog or digital input signal 127 is provided by pad 109 which may be coupled to an electrostatic discharge (ESD) circuit 103, if desired. If the input signal 127 is digital, it is provided to a CMOS inverter path 121 or a Schmitt trigger inverter path 122, depending upon the programming. If the input signal is analog, to comply with any of the advanced I/O standards including but not limited to High-Speed Transceiver Logic (HSTL) and Stub Series Terminated Logic (SSTL), it is provided to path 123 comprising a comparator 108. The comparator 108 compares the analog input signal to the reference voltage $V_{REF}$ to determine whether it is a logic bit "1" or logic bit "0". Multiplexer 107 couples paths 121, 122 or 123 to output node 125 which is coupled to the desired receiving logic blocks 135. The signal on output node 125 may pass through a feedback path, if desired, that is coupled to block 104 comprising a decoder 140 which drives a feedback signal at node 106 to be pull-up, pull-down or rail-to-rail feedback, dependent upon programming. Feedback signal 106 is programmed to communicate with multiplexer 107 via one of the digital input paths 121 or 122.

Figure 2:
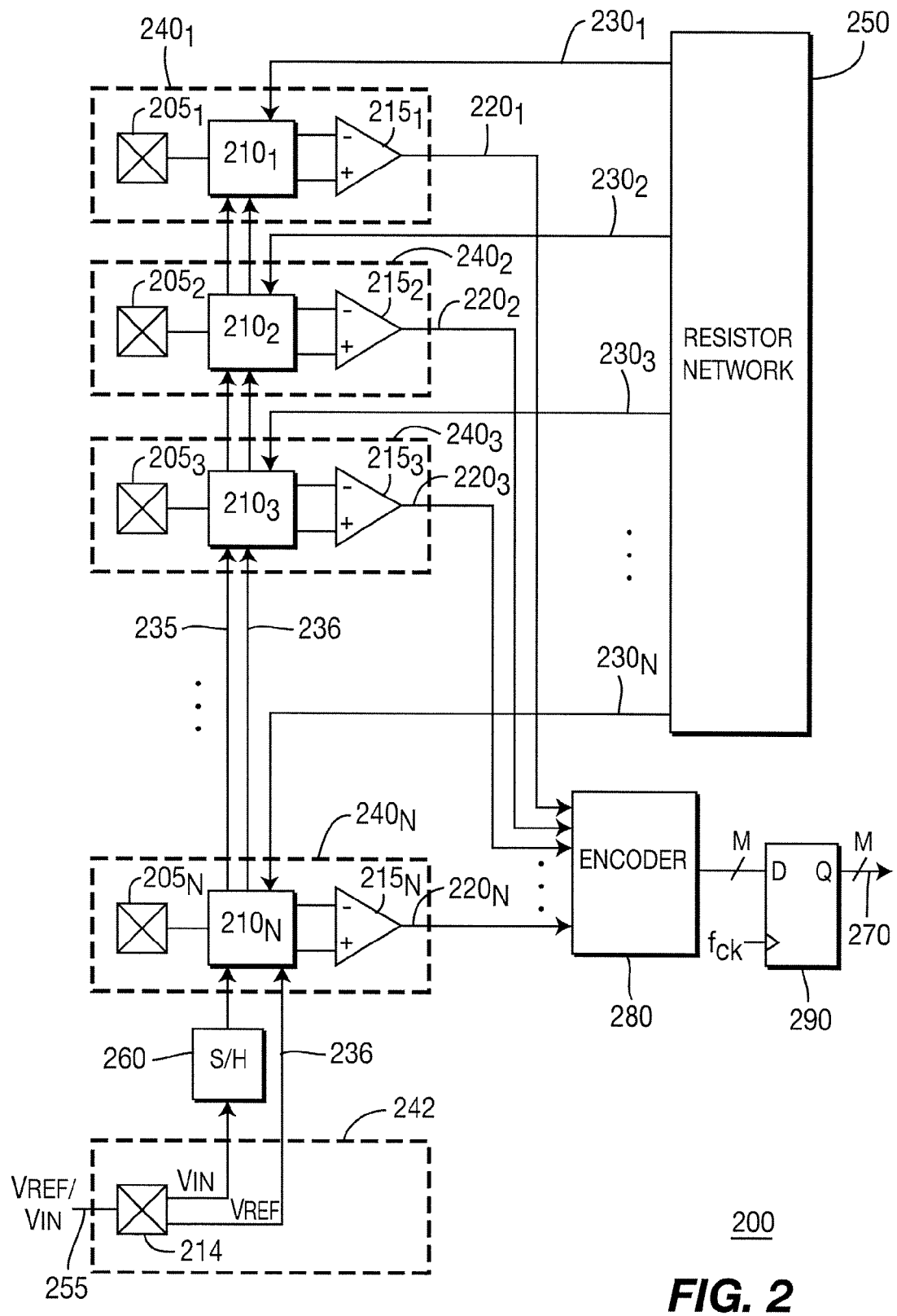
FIG. 2 is circuit for providing an analog-to-digital converter (ADC) in a PLD in accordance with an embodiment of the present invention.

FIG. 2 is a circuit 200 for providing an ADC in a PLD in accordance with an embodiment of the present invention. The circuit 200 comprises an input signal $V_{IN}V_{REF}$ 255, I/O block 242, a plurality of I/O blocks $240_1$ to $240_N$, a resistor network 250, an encoder 280, a storage register 290 and an output signal 270. I/O block 242 receives the analog input signal for analog-to-digital conversion and may include any or all of the components of I/O block 100 in FIG. 1, or any I/O block of a PLD in general. I/O blocks $240_1$ to $240_N$ contain pads $205_1$ to $205_N$, respectively, each like pad 109 in FIG. 1, and comparators $215_1$ to $215_N$, respectively, each like comparator 108 in FIG. 1. The I/O blocks $240_1$ to $240_N$ may have any or all of the components as shown in I/O block 100, or any I/O block in general, for providing input/output functionality and N may be any number. I/O blocks $240_1$ to $240_N$ further contain switching circuits $210_1$ to $210_N$ for the purpose of implementing the ADC. The switching circuits $210_1$ to $210_N$, described in detail below, are coupled to resistor network 250 via interconnects $230_1$ to $230_N$.

Circuit 200 may selectively be set to disable or enable an ADC function (i.e. an ADC mode). The operating mode is preferably set upon initialization or programming of the circuit 200, such as during power up, but may be set and reset at any time. When ADC mode is disabled, I/O blocks $240_1$ to $240_N$ provide I/O functionality and the resistor network 250 is disabled. Reference voltage $V_{REF}$ 255 input to I/O block 242 is provided as the reference voltage to the comparators in I/O blocks $240_1$ to $240_N$. $V_{REF}$ 255 is coupled to pad 214 and is communicated to switching circuits $210_1$ to $210_N$ via connector 236. Switching circuits $210_1$ to $210_N$ provide $V_{REF}$ to the non-inverting input lead of comparators $215_1$ to $215_N$, respectively.

When ADC mode is activated, an analog input signal $V_{IN}$ 255 received at pad 214 is preferably provided to a sample and hold circuit 260 and then to each of the switching circuits $210_1$ to $210_N$ via a coupling 235. Each switching circuit $210_1$ to $210_N$ provides signal $V_{IN}$ to the inverting input of corresponding comparator $215_1$ to $215_N$. The resistor network 250 provides reference voltage levels $230_1$ to $230_N$ to switching circuits $210_1$ to $210_N$, respectively, which couple the received reference voltage level to the non-inverting input of comparators $215_1$ to $215_N$, respectively. Alternatively, depending on the configuration of comparators $215_1$ to $215_N$, the reference voltages $230_1$ to $230_N$ may be provided to the non-inverting inputs and the analog input signal $V_{IN}$ may be provided to the inverting inputs. While comparators $215_1$ to $215_N$ are used for ADC functionality, other components within the I/O blocks $240_1$ to $240_N$ may provide other I/O functionality such as inputting or outputting digital signals.

The set of reference voltages provided by resistor network 250 may be equally divided voltages or ranges of a PLD supply voltage, as desired. Comparators $215_1$ to $215_N$ compare $V_{IN}$ to the given reference voltages to provide corresponding discrete digital values $220_1$ to $220_N$, respectively. The set of digital logic values $220_1$ to $220_N$ uniquely identify the voltage range of $V_{IN}$. Encoder 280 encodes the N logic values $220_1$ to $220_N$ into an M bit digital values. In a preferred embodiment, the encoding provides the binary number for one less the number of logic "1"s. However, in other embodiments of the present invention, any desired digital encoding can be used. The digital value output by encoder 280 is latched by a digital register 290 having sampling clock signal $f_{ck}$ which provides an M bit ADC result 270, which may be fed back into the I/O blocks or the core of a PLD for additional processing. In an example of a preferred embodiment, referring to FIG. 1, a fourth input path to multiplexer 107 (not shown) can be included for feedback of a bit of the ADC result into the chip via an I/O block. Accordingly, an M bit ADC result is fed back into the chip via input paths into the multiplexers of M I/O blocks. In another embodiment, the ADC result is directly fed back into internal logic, bypassing any I/O blocks.

Figure 3:
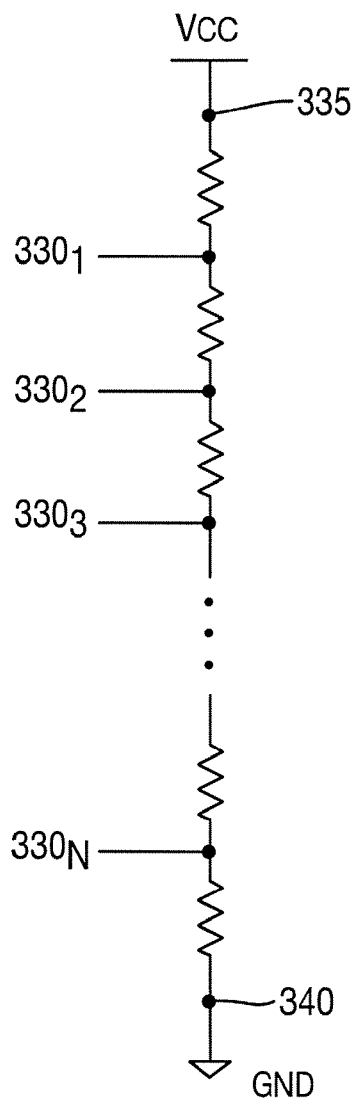
FIG. 3 is a resistor network implementation in accordance with an embodiment of the present invention.

FIG. 3 is a resistor network implementation 300 in accordance with an embodiment of the present invention. Nodes $330_1$ to $330_N$ correspond to nodes $230_1$ to $230_N$ in FIG. 2, respectively. Node 335 is coupled to the PLD supply voltage level $V_{CC}$ and node 340 is coupled to ground GND. To provide precise resistor ratios that substantially divide the voltage level $V_{CC}$ into substantially equal parts, all the resistor segments are preferably laid out next to each other symmetrically and are matched with dummy resistors surrounding the edge in order to provide equivalent boundary conditions. It is noted, however, that the resistor segments may be laid out in any manner, as desired.

Purely by way of example, the circuit 200 described in FIG. 2 provides a 3 bit ADC result and hence N=8 intermediate logic values. As an example, if $V_{CC}$ at node 335 is equal to 1.8V, then the voltage levels from nodes $330_1$ to $330_N$ are decremented by 0.225V sequentially to divide $V_{CC}$ into equal parts providing a plurality of reference voltage signals. An example mapping of voltage ranges to logic values for a 3 bit ADC having a PLD supply voltage level of 1.8V is provided in Table 2.

TABLE 2

| Input Voltage Level | Logic values $220_1$ to $220_N$ | ADC result 270 |
|---|---|---|
| 1.575 V–1.8 V | 1111 1111 | 111 |
| 1.35 V–1.575 V | 0111 1111 | 110 |
| 1.125 V–1.35 V | 0011 1111 | 101 |
| 0.9 V–1.125 V | 0001 1111 | 100 |
| 0.9 V–0.675 V | 0000 1111 | 011 |
| 0.45 V–0.675 V | 0000 0111 | 010 |
| 0.225 V–0.45 V | 0000 0011 | 001 |
| 0 V–0.225 V | 0000 0001 | 000 |

Figure 4:
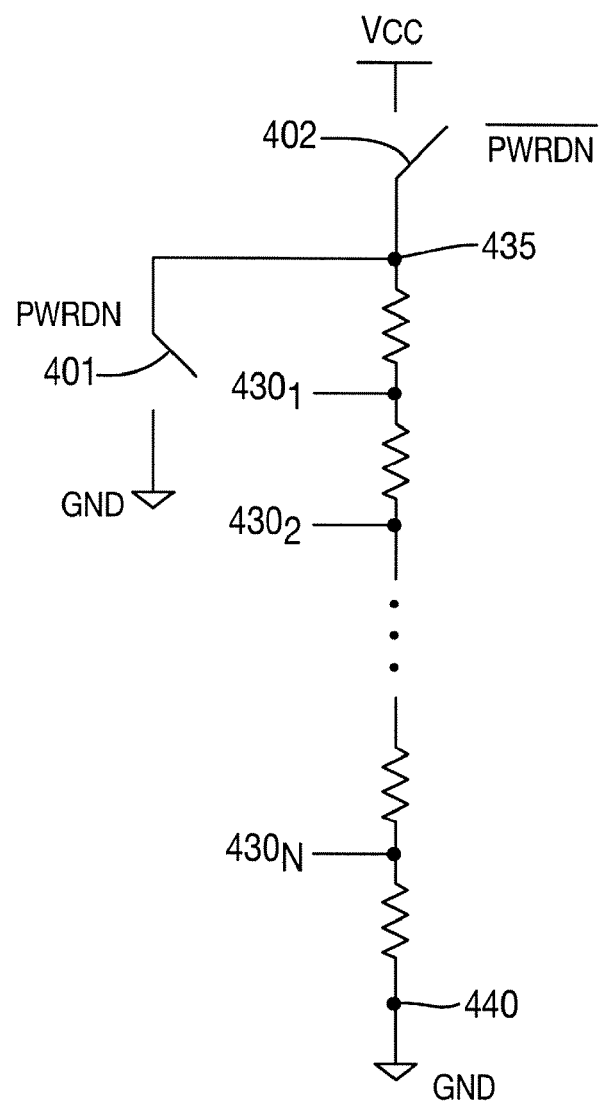
FIG. 4 is a resistor network implementation with a power-down feature in accordance with an embodiment of the present invention.

Since the resistor string 300 consumes power by conducting current from $V_{CC}$ to GND even when the chip is in power down mode, standby mode, or disabled ADC mode, it is desirable to selectively control the resistor network 250 in the circuit 200. FIG. 4 is a resistor network implementation 400 with a power-down feature in accordance with an embodiment of the present invention. Switches 401 and 402 cut off current flow from $V_{CC}$ to GND when the resistor string 250 is disabled. Nodes $430_1$ to $430_N$, 435 and 440 correspond to nodes $330_1$ to $330_N$, 335 and 340 in FIG. 3, respectively. PWRDN is a programmable logic value that defines the state of switches 401 and 402, which may be any type of transistor. As an example, if PWRDN is programmed to logic "1", switch 401 is closed coupling node 435 to GND and switch 402 is open so that $V_{CC}$ is disconnected from the resistor string. If PWRDN is programmed to logic "0", switch 401 is open and switch 402 is closed coupling $V_{CC}$ to node 435 providing the operation described above for resistor string 300.

Referring back to FIG. 2, an overall ADC implementation may have a plurality of circuits $200_1$ to $200_N$ (not shown) in the same PLD. The plurality of circuits $200_1$ to $200_N$ may exist separately or sequentially providing multiple stages to achieve a finer ADC resolution result. For a plurality of sequential circuits $200_1$ to $200_N$, each subsequent or additional stage provides a finer granularity to the range of $V_{IN}$. Purely by way of example, a two-stage ADC converter producing a 6 bit ADC result may have two sequential stages of circuit 200 (i.e. $200_1$ and $200_2$) with the first stage circuit $200_1$ providing a 3 bit ADC value at register output 270 corresponding to the voltage range of $V_{IN}$. The second stage circuit $200_2$ may use the upper and lower values of the voltage range of $V_{IN}$ 255 in the first stage circuit $200_1$ to replace the values of $V_{CC}$ and GND in the resistor network 250 to provide a finer digital resolution by equally dividing the voltage range provided by the first stage circuit $200_1$ into any number of sub ranges and selecting the range to which voltage $V_{IN}$ belongs.

Figure 5:
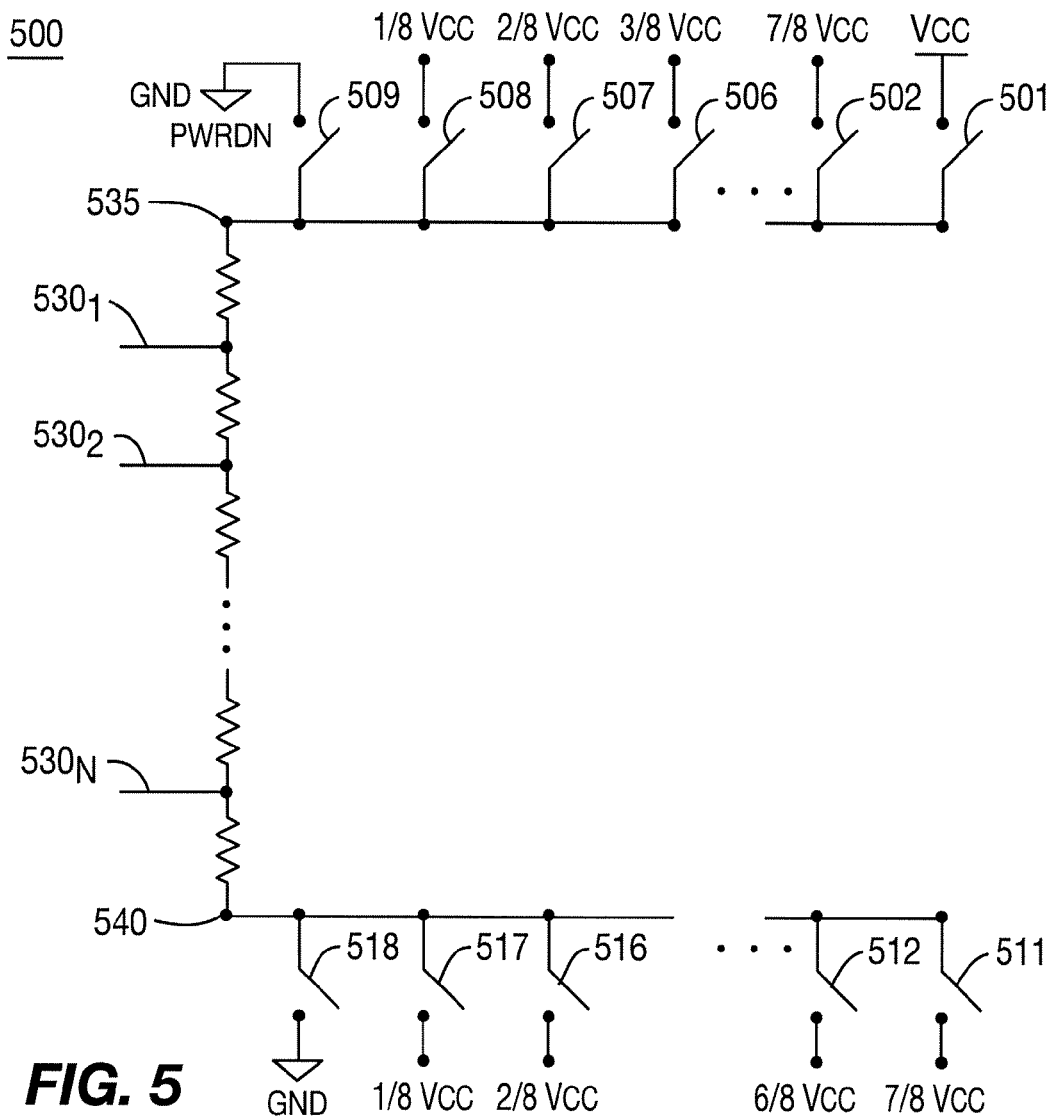
FIG. 5 is a resistor network for a second stage circuit in accordance with an embodiment of the present invention.

FIG. 5 is a resistor network 500 for a second stage circuit such as $200_2$, in accordance with an embodiment of the present invention. Nodes $530_1$ to $530_N$, 535 and 540 correspond to nodes $330_1$ to $330_N$, 335 and 340 in FIG. 3, respectively. To protect against undesirable current flow and power dissipation across the resistor string from the supply voltage, switch 509 is open when ADC mode is active and is closed with ADC mode is disabled coupling node 535 to GND. When ADC mode is active, switches 501-508, and 511-518 may be selectively opened and closed to set the voltage values at nodes 535 and 540 to correspond to the upper and lower limits, respectively, of the voltage range of $V_{IN}$ determined by the first stage circuit $200_1$.

Purely by way of example, if $V_{CC}$=1.8V and a voltage range of $V_{IN}$ provided by first stage circuit $200_1$ is between 1.575V and 1.8V, switches 501 and 511 are closed coupling node 535 to 1.8V and node 540 to 1.575V, respectively, and switches 502-508, and 512-518 are opened. The reference voltages $530_1$ to $530_N$ equally divide the voltage range 1.575V to 1.8V to any N number of points. The second stage circuit $200_2$ provides a 3 bit ADC value at register output 270 uniquely corresponding to the voltage range of $V_{IN}$ at a finer resolution than the first stage levels providing an overall 6 bit ADC result.

Figure 6:
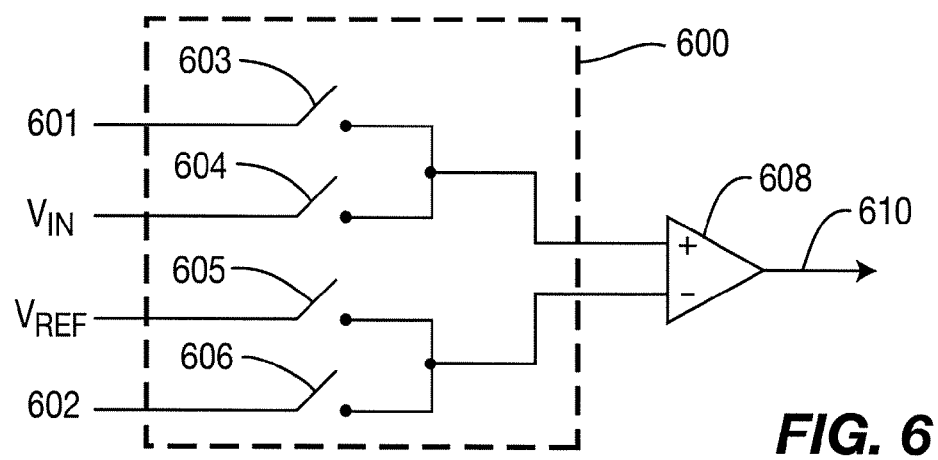
FIG. 6 is a set of programmable switches that provide a plurality of input options to the comparator of an I/O block in accordance with an embodiment of the present invention.

FIG. 6 is a switching circuit 600 corresponding to switching circuits $210_1$ to $210_N$ of FIG. 2 in accordance with an embodiment of the present invention for providing multi-purpose functionality of I/O blocks $240_1$ to $240_N$. Comparator 608 corresponds to comparators $215_1$ to $215_N$ of FIG. 2. Switches 603, 604, 605 and 606 are programmed depending on the desired operating mode of circuit 200 provided by a programming signal. If ADC mode is disabled, switches 603 and 605 are closed, switches 604 and 606 are opened and comparator 608 is configured for regular analog input functionality. Accordingly, reference voltage $V_{REF}$, provided to the switching circuits from input node 255 of I/O block 242, is coupled to the non-inverting input of comparator 608 and node 601 couples a received analog signal from each individual pad $205_1$ to $205_N$ to the inverting input of comparator 608. If ADC mode is active, switches 603 and 605 are open and switches 604 and 606 are closed coupling the input voltage $V_{IN}$ to the inverting input, and node 602 to the non-inverting input of comparator 608. Node 602 receives a reference voltage level from the resistor network 250 as described in FIG. 2 and comparator 608 provides a discrete digital output value 610.

Figure 7:
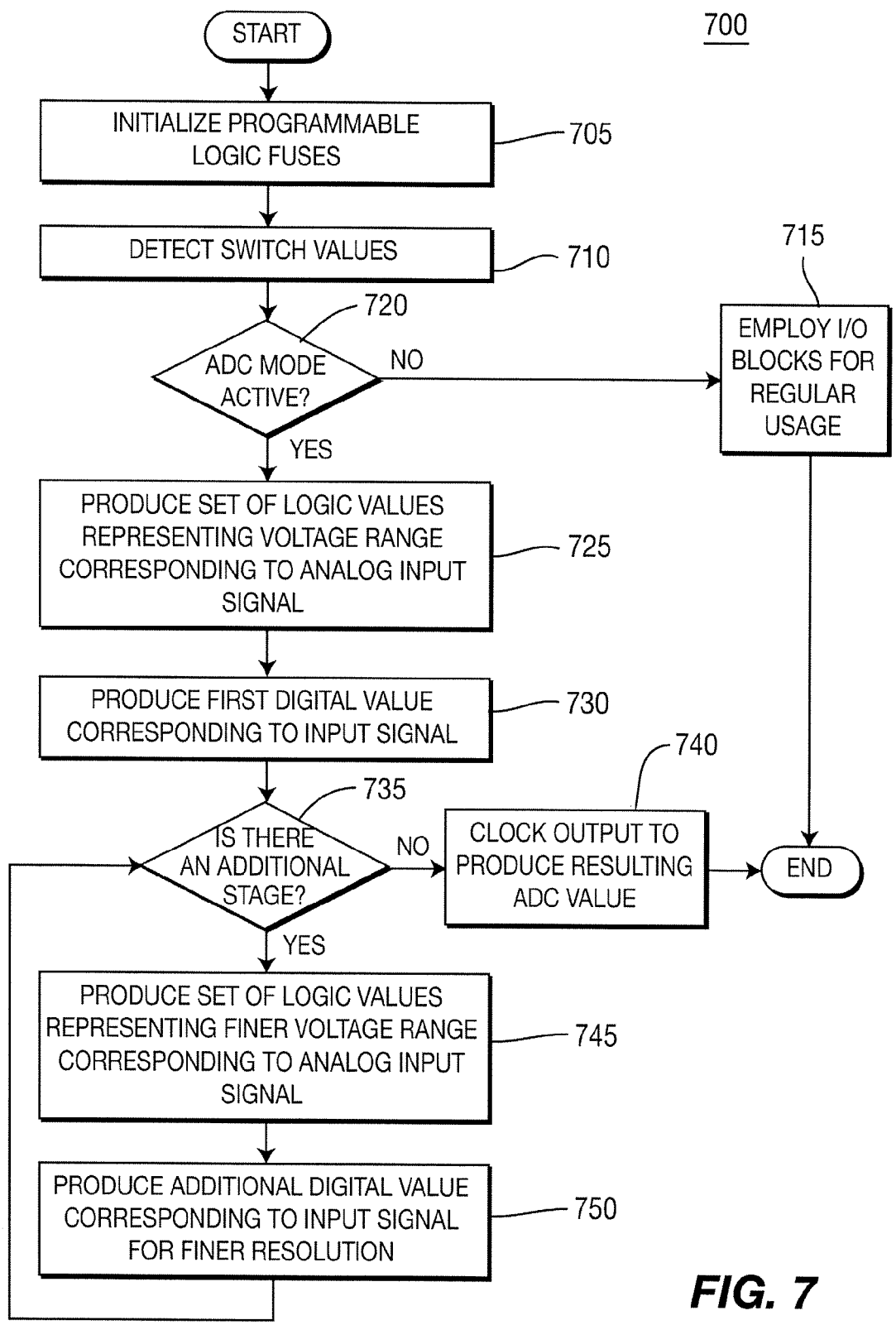
FIG. 7 is a method for implementing an analog-to-digital converter in a PLD in accordance with an embodiment of the present invention.

FIG. 7 is a method for implementing an ADC in a PLD in accordance with an embodiment of the present invention. In step 705, the PLD programmable logic values, also referred to as programmable logic fuses are initialized or programmed. Initialization includes setting the operating mode and any switch values as described above. In step 710, the switch values are detected. In step 720 it is determined whether ADC mode is active. If ADC mode is disabled, I/O blocks of the PLD are employed for regular analog and digital input/output usage in step 715 and power is disabled to the resistor network as described in FIGS. 4 and 5. If ADC mode is active, a set of logic values representing the voltage range of the analog input signal in step 725 is provided. In step 730, the logic values from step 725 are encoded into a first stage digital value using multi-purpose I/O blocks in the PLD. Since the I/O blocks are multi-purpose, they may also concurrently be used to provide I/O functionality for digital signals. In step 735 it is determined if there is an additional stage of the ADC, which may be a second stage or any subsequent stage, and which may be dependent and determined by the last ADC result. If there are no additional stages, the digital value is clocked to produce a digital ADC result in step 740. If there is an additional stage, an additional set of logic values are produced defining a finer voltage range corresponding to the analog input signal in step 745. In step 750, the logic values from step 745 are encoded into an additional stage digital value.

Although the features and elements of the present invention are described in the preferred embodiments in particular combinations, each feature or element can be used alone without the other features and elements of the preferred embodiments or in various combinations with or without other features and elements of the present invention. The present invention may be implemented in a computer program or firmware tangibly embodied in a computer-readable storage medium having machine readable instructions for execution by a machine, a processor, and/or any general purpose computer for use with or by any non-volatile memory device. Suitable processors include, by way of example, both general and special purpose processors. The instructions may provide a process to implement the above functionality of the ADC in any PLD.

Typically, a processor will receive instructions and data from a read only memory (ROM), a RAM, and/or a storage device having stored software or firmware. Storage devices suitable for embodying computer program instructions and data include all forms of non-volatile memory, including by way of example semiconductor memory devices, read only memories (ROMs), magnetic media such as internal hard disks and removable disks, magneto-optical media, and optical media such as CD-ROM disks and digital versatile disks (DVDs). Types of hardware components, processors, or machines which may be used by or in conjunction with the present invention include Application Specific Integrated Circuits (ASICs), Field Programmable Gate Arrays (FPGAs), microprocessors, or any integrated circuit.

What is claimed is:

1. An apparatus for providing an analog-to-digital converter (ADC) in a programmable logic device (PLD) comprising:
   a plurality of input/output (I/O) blocks having a plurality of switching circuits and a plurality of comparators, wherein the plurality of I/O blocks provide the ADC;
   a sample and hold circuit coupled to the plurality of I/O blocks providing an analog input signal;
   a programming signal for selectively switching the plurality of switching circuits to provide the analog input signal to the plurality of comparators;
   a resistor network coupled to the plurality of switching circuits and comparators providing a first plurality of reference voltage signals, the plurality of comparators comparing the analog input signal to the first plurality of reference voltage signals and providing a plurality of discrete digital values;
   an encoder for converting the plurality of discrete digital values to a plurality of M bit digital values and providing the M bit digital values to the PLD for processing, and
   wherein the plurality of I/O blocks provide I/O functionality while an ADC mode is enabled in the plurality of I/O blocks.

2. The apparatus of claim 1, wherein the resistor network comprises switches for disabling current in the resistor network when the plurality of I/O blocks do not provide ADC functionality.

3. The apparatus of claim 1, wherein the resistor network divides a supply voltage level into the first plurality of reference voltage signals representing a voltage range.

4. The apparatus of claim 3 comprising a plurality of switches coupled to the resistor network for dividing the supply voltage level into a subsequent plurality of reference voltage signals.

5. The apparatus of claim 4, wherein the plurality of switches are selectively controlled depending on the plurality of discrete digital values.

6. The apparatus of claim 1, wherein the resistor network is located on a same chip as the PLD.

7. The apparatus of claim 1, wherein the plurality of M bit digital values are feedback to the plurality of I/O blocks.

8. The apparatus of claim 1, wherein the plurality of M bit digital values are feedback to a plurality of logic blocks.

9. A method for providing an analog-to-digital converter (ADC) in a programmable logic device (PLD) having a plurality of input/output (I/O) blocks, the method comprising:
   initializing programmable logic fuses;
   detecting switching values to determine if an ADC mode is desired;
   inputting an analog signal;
   providing a first plurality of reference voltage signals by a resistor network for producing a plurality of discrete digital values representing a voltage range of the analog input signal;
   producing a plurality of digital values corresponding to the plurality of discrete digital values; and
   providing I/O functionality while the ADC mode is enabled in the plurality of I/O blocks.

10. The method of claim 9 wherein the resistor network is disabled when the ADC mode is disabled.

11. The method of claim 9 comprising at least one more stage having a plurality of switches for producing a subsequent plurality of reference voltage signals.

12. The method of claim 11 wherein the plurality of switches are selectively controlled to produce the subsequent plurality of reference voltage signals.

13. The method of claim 11 wherein the subsequent plurality of reference voltage signals are related to a divided supply voltage level.

14. The method of claim 9 wherein the first plurality of reference voltage signals are related to a divided supply voltage level.

15. A machine readable storage medium having a stored set of instructions executable by a machine for an analog-to-digital converter (ADC) in a programmable logic device (PLD) having a plurality of input/output (I/O) blocks, the instructions comprising:
   instructions to initialize programmable logic fuses;
   instructions to detect switch values to determine if an ADC mode is desired;
   instructions to input an analog signal;
   instructions to provide a first plurality of reference voltage signals by a resistor network for producing a plurality of discrete digital values representing a voltage range of the analog input signal;
   instructions to produce a plurality of digital values corresponding to the plurality of discrete digital values; and
   instructions to provide I/O functionality while the ADC mode is enabled in the plurality of I/O blocks.

16. The machine readable storage medium of claim 15 having instructions to disable the resistor network when the ADC mode is disabled.

17. The machine readable storage medium of claim 15 having instructions to provide at least one more stage having a plurality of switches for producing a subsequent plurality of reference voltage signals.

18. The machine readable storage medium of claim 17 having instructions to selectively control the plurality of switches to produce the subsequent plurality of reference voltage signals.

* * * * *

UNITED STATES PATENT AND TRADEMARK OFFICE
CERTIFICATE OF CORRECTION

PATENT NO.        : 7,446,690 B2                                   Page 1 of 1
APPLICATION NO. : 11/556982
DATED             : November 4, 2008
INVENTOR(S)       : Kao It is certified that error appears in the above-identified patent and that said Letters Patent is hereby corrected as shown below:

In column 3, line 49, delete "$V_{IN}V_{REF}$" and insert -- $V_{IN}/V_{REF}$ --, therefor.

In column 6, line 5, delete "$V_{IN}$provided" and insert -- $V_{IN}$ provided --, therefor.

Signed and Sealed this

Twenty-fourth Day of February, 2009

JOHN DOLL
*Acting Director of the United States Patent and Trademark Office*